(12) United States Patent
Chen

(10) Patent No.: US 9,111,597 B2
(45) Date of Patent: Aug. 18, 2015

(54) MEMORY DEVICE STRUCTURE WITH DECODERS IN A DEVICE LEVEL SEPARATE FROM THE ARRAY LEVEL

(71) Applicant: Shih-Hung Chen, Hsinchu (TW)

(72) Inventor: Shih-Hung Chen, Hsinchu (TW)

(73) Assignee: MACRONIX INTERNATIONAL CO., LTD., Hsinchu (TW)

(*) Notice: Subject to any disclaimer, the term of this patent is extended or adjusted under 35 U.S.C. 154(b) by 179 days.

(21) Appl. No.: 13/721,523

(22) Filed: Dec. 20, 2012

(65) Prior Publication Data

US 2014/0177311 A1    Jun. 26, 2014

(51) Int. Cl.
*H01L 23/48*    (2006.01)
*G11C 8/10*    (2006.01)
*G11C 5/02*    (2006.01)

(52) U.S. Cl.
CPC . *G11C 8/10* (2013.01); *G11C 5/025* (2013.01)

(58) Field of Classification Search
CPC ............ H01L 27/0688; H01L 27/0694; H01L 23/498; H01L 23/49805; H01L 23/50; G11C 8/10
USPC .................................. 257/499, 735; 365/51, 63
See application file for complete search history.

(56) References Cited

U.S. PATENT DOCUMENTS

| 3,704,455 | A | * | 11/1972 | Scarbrough | 365/52 |
|---|---|---|---|---|---|
| 5,581,498 | A | * | 12/1996 | Ludwig et al. | 365/63 |
| 6,133,640 | A | * | 10/2000 | Leedy | 257/778 |
| 7,379,328 | B2 | * | 5/2008 | Osada et al. | 365/163 |
| 7,473,589 | B2 | | 1/2009 | Lai et al. | |
| 7,978,492 | B2 | * | 7/2011 | Johnson et al. | 365/63 |
| 2005/0280156 | A1 | * | 12/2005 | Lee | 257/758 |
| 2008/0254572 | A1 | * | 10/2008 | Leedy | 438/109 |
| 2010/0157647 | A1 | * | 6/2010 | Rinerson et al. | 365/51 |
| 2011/0084397 | A1 | * | 4/2011 | Lung | 257/774 |
| 2011/0121366 | A1 | * | 5/2011 | Or-Bach et al. | 257/204 |
| 2012/0182804 | A1 | | 7/2012 | Hung et al. | |
| 2013/0248801 | A1 | * | 9/2013 | Yamamoto | 257/4 |

* cited by examiner

*Primary Examiner* — Earl Taylor
(74) *Attorney, Agent, or Firm* — Haynes Beffel & Wolfeld LLP

(57) ABSTRACT

A memory device structure and method of fabricating the memory device structure is described. The memory device structure has a memory array disposed in a array level and peripheral circuitry, including decoders and other peripheral circuitry, disposed in a device level. The array of memory cells has a perimeter that defines a cylinder that extends above and beneath the array of memory cells. The decoders and the other peripheral circuitry or at least part of the decoders and the other peripheral circuitry are disposed within the cylinder in the device level. The memory device structure also includes a plurality of pads in a pad level. A first plurality of inter-level conductive lines electrically couples the decoders to the bit lines and word lines in the array of memory cells.

16 Claims, 9 Drawing Sheets

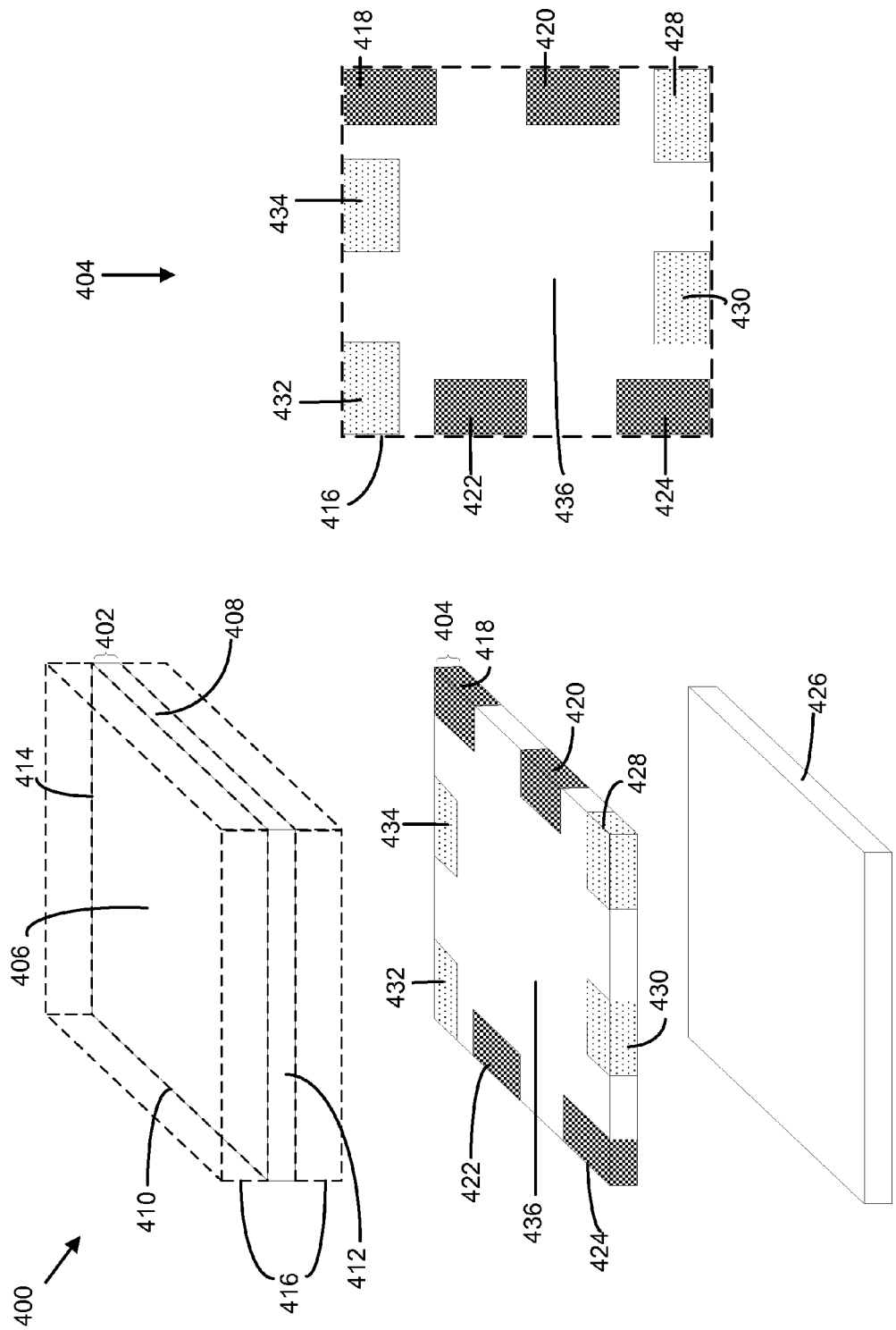

MEMORY DEVICE STRUCTURE WITH DECODERS IN A DEVICE LEVEL SEPARATE FROM THE ARRAY LEVEL

BACKGROUND

1. Field of the Invention

The present invention relates to structures for memory devices and particularly to high density memory cell device structures.

2. Description of Related Art

Memory devices utilize memory cells arranged in an array to store data. Operations are performed on specific memory cells in the array of memory cells through the use of decoders which connect to the word lines and bit lines in the array, supported by other peripheral circuits located in a peripheral region on the memory device. In typical memory device structures, the decoders are disposed adjacent to the array of memory cells increasing the area of the device. Additionally, other peripheral circuits are disposed in peripheral regions around the decoders and the array of memory cells increasing the area of the device. This structure is utilized in various types of memory, including volatile DRAM memory and non-volatile NOR/NAND Flash memory.

This memory device structure is disadvantageous for numerous reasons. First, the memory device structure with the decoders and the peripheral region in which the peripheral circuits are disposed being around the array of memory cells has a large footprint. The large footprint of the memory device structure results in large chip sizes.

Second, this memory device structure is disadvantageous for the high costs of manufacturing. Often the manufacturing steps needed to form the memory array are different than those needed to form the decoders and peripheral circuits. This requires complex interleaving of the processes.

It is therefore desirable to provide a memory device structure with a small footprint. It is also desirable to provide a memory device structure that can be manufactured at lower costs.

SUMMARY

The present invention provides a structure for a memory device and a method for making the memory device structure.

The memory device structure includes an array of memory cells disposed in an array level and decoders and other circuitry, normally disposed in the peripheral region of the prior art memory device structure, disposed in a device level. The array of memory cells can include stacked layers of 2D arrays of memory cells to create a 3D array of memory cells. The device level can either be disposed above or below the array level. The perimeter of the array of memory cells in the array level defines a cylinder that extends both above and below the array defining an area inside the cylinder on the device level. In one embodiment both of the decoders and some or all of the other peripheral circuitry are disposed completely within the cylinder on the device level. In alternate embodiments at least a portion of the decoders may be disposed within the cylinder in the device level. In other alternate embodiments, either one of the x-decoder or the y-decoder is disposed completely within the cylinder while the other of the x-decoder or the y-decoder is disposed completely outside of the cylinder.

The array of memory cells includes bit lines and word lines coupled to the columns and rows of memory cells within the array. A first plurality of inter-level conductive lines electrically couple the bit lines and word lines to the decoders in the device level. The inter-level conductive lines include portions that extend from outside of the cylinder to inside of the cylinder to make contact in the array level. As a result, the inter-level conductive lines do not pass through the array of memory cells in locations inside the cylinder.

The memory device structure can also include a pad level that includes a plurality of pads inside the cylinder. The pads can have contact regions for input/output (I/O) contacts, power supply contacts, ground supply contacts, data and address contacts and so on. In one embodiment all of the pads are disposed within the cylinder in the pad level. In alternate embodiments, the pads are disposed so that some pads or portions of some pads lie partially or completely inside of the cylinder in the pad level. The pads are electrically coupled to the decoder and other circuitry in the device level through a second plurality of inter-level conductive lines. The inter-level conductive lines of the second plurality include portions that extend from outside of the cylinder to inside of the cylinder to make contact in the pad level. As a result, the inter-level conductive lines of the second plurality do not pass through the array of memory cells in locations inside the cylinder.

Other aspects and advantages of the present invention can be seen on review of the drawings, the detailed description, and the claims which follow.

BRIEF DESCRIPTION OF THE DRAWINGS

FIG. 4A is an exploded perspective view of an alternative memory device structure in which the x-decoder and the y-decoder are both disposed beneath the memory array.

FIG. 4B is a layout view of the device level of the memory device structure shown in FIG. 4A.

DETAILED DESCRIPTION

A detailed description of embodiments of the present invention is provided with reference to the FIGS. 1-8.

Figure 1:
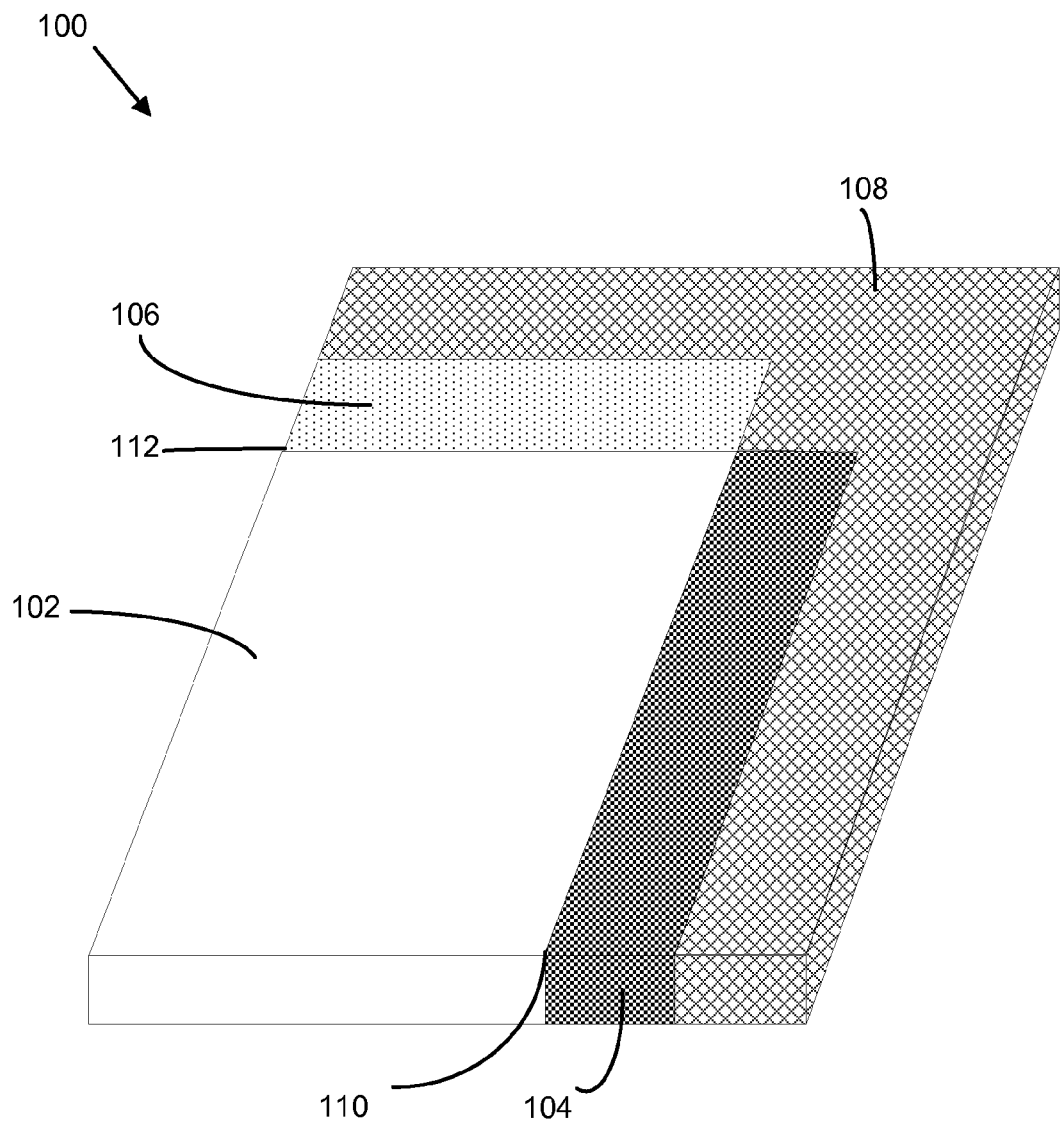
FIG. 1 is a perspective view of a prior art memory device structure with the memory array, the x-decoder, the y-decoder and other peripheral circuitry all within the same level.

FIG. 1 is a perspective view of a prior art memory device structure with the memory array, the x-decoder, the y-decoder and other peripheral circuitry all within the same level. The memory device 100 includes a memory array 102, and peripheral circuitry including an x-decoder 104, a y-decoder 106 and other peripheral circuits 108 in a peripheral region. The memory array 102, and the peripheral circuitry including an x-decoder 104, a y-decoder 106 and other peripheral circuits 108 are all within the same level. Specifically, the x-decoder 104 is adjacent to the memory array 102 along side 110. The y-decoder 106 is adjacent to the memory array 102 along side 112. The other peripheral circuits 108 are in a region adjacent to the x-decoder 104 and the y-decoder 106. The other peripheral circuits can include page buffers, sense circuitry, control circuitry, supply voltage circuitry and any other circuitry used in performing operations on the cells within the array of memory cells. Also, the other peripheral circuits can include processors, special purpose logic, communication interfaces and other components that can be integrated on a single chip with the memory array.

Figure 2A:
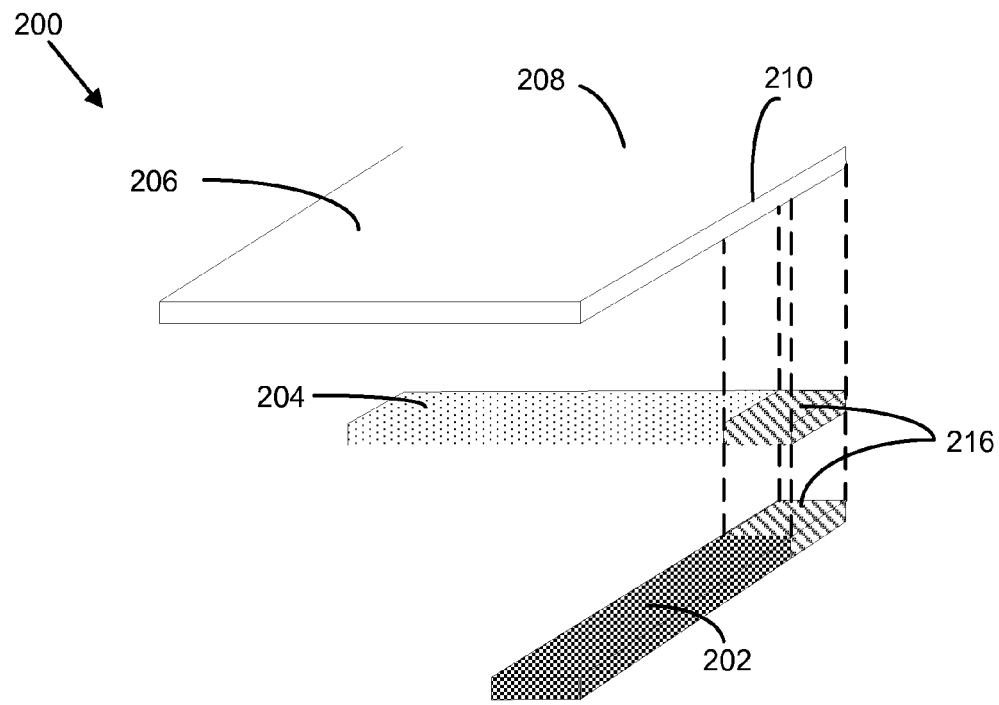
FIG. 2A is an exploded perspective view of a memory device structure with an x-decoder and y-decoder underneath the memory array.
Figure 2B:
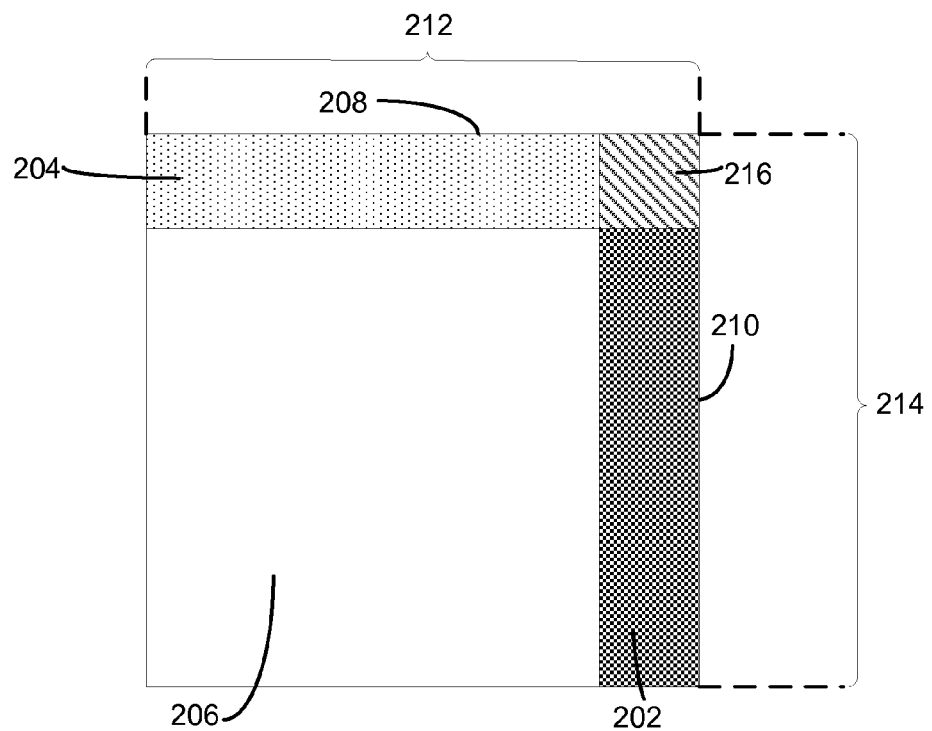
FIG. 2B is a bottom layout view of the memory device structure shown in FIG. 2A.

FIG. 2A is an exploded perspective view of a memory device structure with an x-decoder and y-decoder underneath the memory array. FIG. 2B is a layout view of the memory device structure shown in FIG. 2A. The memory device structure 200 shown in FIGS. 2A and 2B includes an x-decoder 202 and a y-decoder 204 disposed underneath a memory array 206. The y-decoder 204 is aligned along a first side 208 of the cylinder defined by the perimeter of the memory array 206. The x-decoder 202 for the purposes of this disclosure is a circuit that includes input nodes at which it receives address signals from a source of addresses, and output nodes which are directly connected to conductors that comprise or connect with individual word lines in the memory array. The y-decoder 204 for the purposes of this disclosure is a circuit that includes input nodes at which it receives address signals from a source of addresses, and output nodes which are directly connected to conductors carrying signals to control column select switches for individual bit lines in the memory array. An x-decoder is disposed completely within the cylinder if the input nodes, output nodes and circuits that carry or transmit signals between the input nodes and the output nodes are within the cylinder. A y-decoder is disposed completely within the cylinder if the input nodes, output nodes and circuits that carry or transmit signals between the input nodes and the output nodes are within the cylinder.

The y-decoder makes connection to column select switches for bit lines, which can be distributed across substantially the whole length 212 of the first side 208 of memory array. For example, there can be a need for connection from each decoder output node to a column select switch on each bit line, and every one or every few columns of cell in the array can need access to an individual bit line. This can result in a need for hundreds or thousands of connections to bit lines from the peripheral circuits to the array.

The x-decoder 202 is aligned along a second side 210 of the cylinder defined by the perimeter of the memory array. The x-decoder makes connection to the word lines, of which there can be possibly thousands distributed across substantially the whole length 214 of the second side 210. If the entire x-decoder and the entire y-decoder configured to extend across the entire width and length of the array 206 are disposed completely underneath the memory array in the manner shown in FIG. 2A, then the decoders, or at least the connections between x-decoder and the array, and connections between the y-decoder and the array, will overlap in region 216.

Figure 3B:
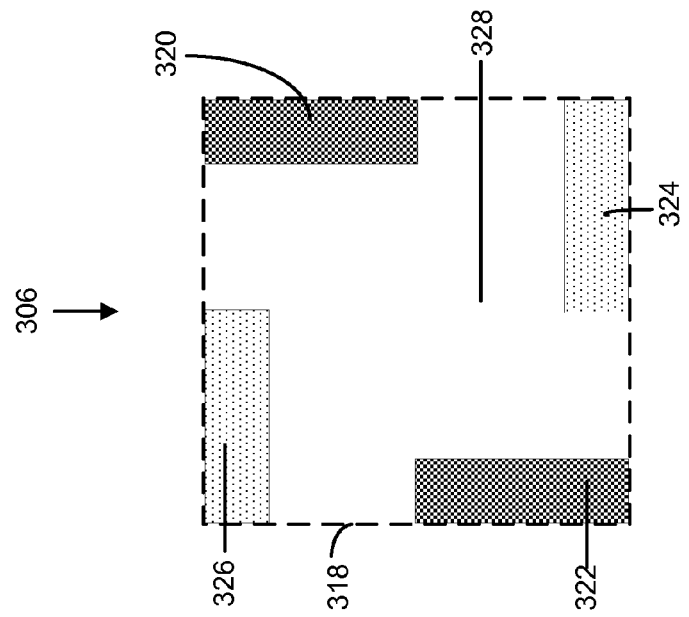
FIG. 3B is a layout view of the device level of the memory device structure shown in FIG. 3A.
Figure 3A:
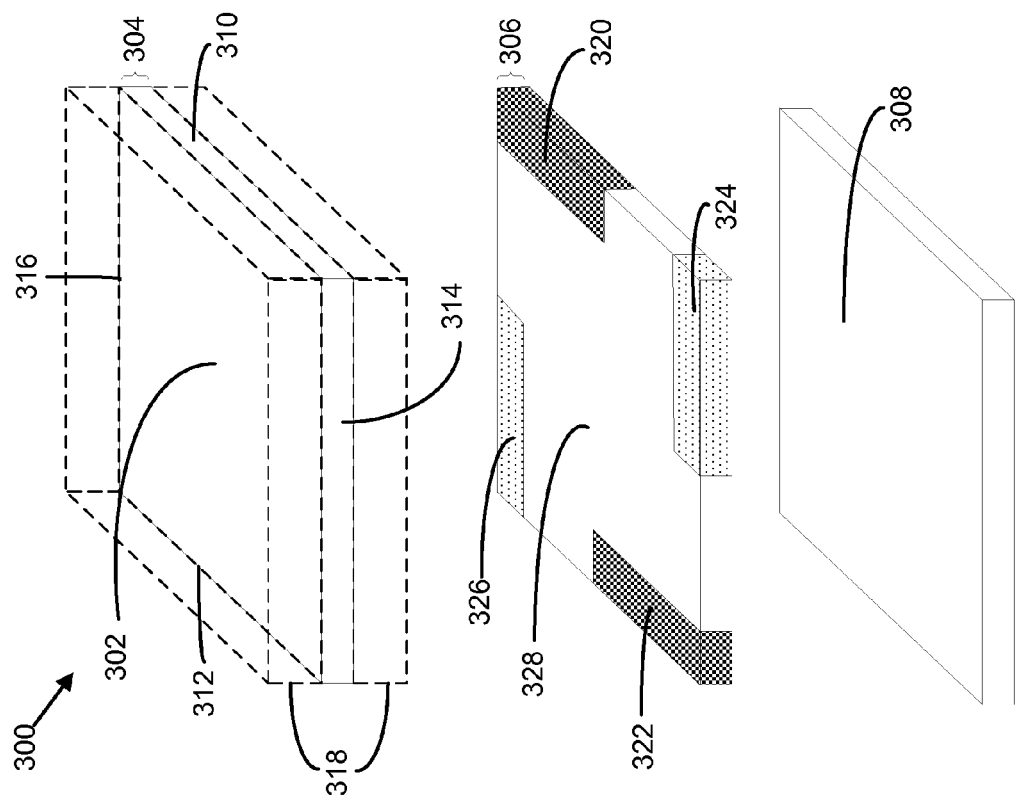
FIG. 3A is an exploded perspective view of a memory device structure in which the x-decoder and the y-decoder are both disposed beneath the memory array.

FIG. 3A is an exploded perspective view of a memory device structure in which the x-decoder and the y-decoder are both disposed beneath the memory array. FIG. 3B is a layout view of the device level of the memory device structure shown in FIG. 3A. The memory device structure 300 in FIG. 3A includes an array level 304 and a device level 306. The device level 306 can be disposed beneath the array level 304, as is shown, or above the array level. The device level is disposed on a substrate 308. The array level includes a memory array 302.

The memory array can be a stacked thin film transistor (TFT) memory array, separated from the device layer by an interlayer dielectric (not shown). Examples of stacked TFT memory array structures and methods for fabricating the same are disclosed in U.S. Pat. No. 7,473,589 B2 entitled "Stacked Thin Film Transistor, Non-Volatile Memory Device and Methods for Fabricating the Same," which is incorporated by reference as if fully set forth herein. Specifically, the memory array can include multiple bit line layers. Specifically, in one example stacked TFT memory array structure, each stacked layer of memory cells includes a bit line layer, a word line conductor and a trapping layer between the bit line layer and the word line conductor. The bit line layer is a thin film and includes a plurality of source/drain regions and channel regions. The resulting structure is a stacked TFT memory array structure.

The memory array 302 has a first side 310, a second side 312, a third side 314 and a fourth side 316. The first side 310 and the second side 312 oppose each other, while the third side 314 and the fourth side 316 oppose each other. The sides 310, 312, 314 and 316 define a perimeter of the array of memory cells. The perimeter of the memory array defines a cylinder 318 (represented by the dashed lines) that extends both above and below the array of memory cells.

A cylinder is defined as the projection of a closed two-dimensional curve, such as the perimeter of the memory array in this example, along an axis that intersects the plane that the entire closed two-dimensional curve is within. The perimeter that defines the two-dimensional curve can be a square, a rectangle, a circle, an ellipse or a somewhat irregular shape depending on the manufacturing process. For simplicity purposes in the present application, the two-dimensional curve is illustrated and described as a square. However, it is appreciated that the two-dimensional curve can be any shape.

The device level 306 includes an x-decoder and a y-decoder for the memory array 302. The x-decoder and the y-decoder are disposed within the cylinder 318. A first portion of the x-decoder 320 is aligned within the cylinder along the first side 310 of the array of memory cells. A second portion of the x-decoder 322 is aligned within the cylinder along the second side 312 of the memory array. Additionally, a first portion of the y-decoder 324 is aligned along the third side 314 of the memory array. A second portion of the y-decoder 326 is aligned along the fourth side 316 of the memory array.

The device level 306 also includes a region 328 within the cylinder 318 in which the portions of the x-decoder and y-decoder are not disposed. Other peripheral circuitry can be disposed within this region 328. By disposing the x-decoder, the y-decoder and other peripheral circuitry within the cylinder and underneath the memory array, the area of the footprint of the memory device structure is decreased.

FIG. 4A is an exploded perspective view of an alternative memory device structure in which the x-decoder and the y-decoder are both disposed beneath the memory array. FIG. 4B is a layout view of the device level of the memory device structure shown in FIG. 4A. As with the memory device structure shown in FIGS. 3A and 3B, the memory device structure 400 shown in FIGS. 4A and 4B includes an array level 402 and a device level 404. The device level 404 is mounted on a substrate 426. The substrate 426 can be comprised of silicon. The array level 402 includes a memory array 406. The memory array has a perimeter including a first side 408, a second side 410, a third side 412 and a fourth side 414. The first side 408 and the second side 410 oppose each other, while the third side 412 and the fourth side 414 oppose each other. The sides 408, 410, 412 and 414 define a perimeter of the memory array. The perimeter of the memory array and an axis normal to the array define a cylinder 416 (represented by the dashed lines) that extends both above and below the memory array.

The device level 404 includes an x-decoder and a y-decoder which are both disposed within the cylinder 416. Specifically, the device level 404 includes a first portion 418 and a third portion 420 of the x-decoder aligned along the first side 408 of memory array 406. A second portion 422 and a fourth portion 424 of the x-decoder are aligned along the second side 410 of the memory array.

Additionally, the device level includes a first portion 428 and a third portion 430 of the y-decoder aligned along a third side 412 of the array of memory cells. A second portion 432 and a fourth portion 434 of the y-decoder are aligned along the fourth side of the array of memory cells, in the device level.

The device level 404 also includes a region 436 within the cylinder 416 in which the portions of the x-decoder and y-decoder are not disposed. Other peripheral circuitry can be disposed within this region 436.

It is appreciated that in an alternate embodiment of the memory device structures shown in FIGS. 3A, 3B, 4A and 4B, the device level can be disposed on top of the array of memory cells. In this alternate embodiment, the device level can have the same layout as the shown embodiments, and be implemented using thin film transistor technology. The array in this embodiment can be implemented in a silicon bulk substrate. As a result, the x-decoder, the y-decoder and other peripheral circuitry are disposed above the memory array within the cylinder defined by the perimeter of the memory array.

Figure 5:
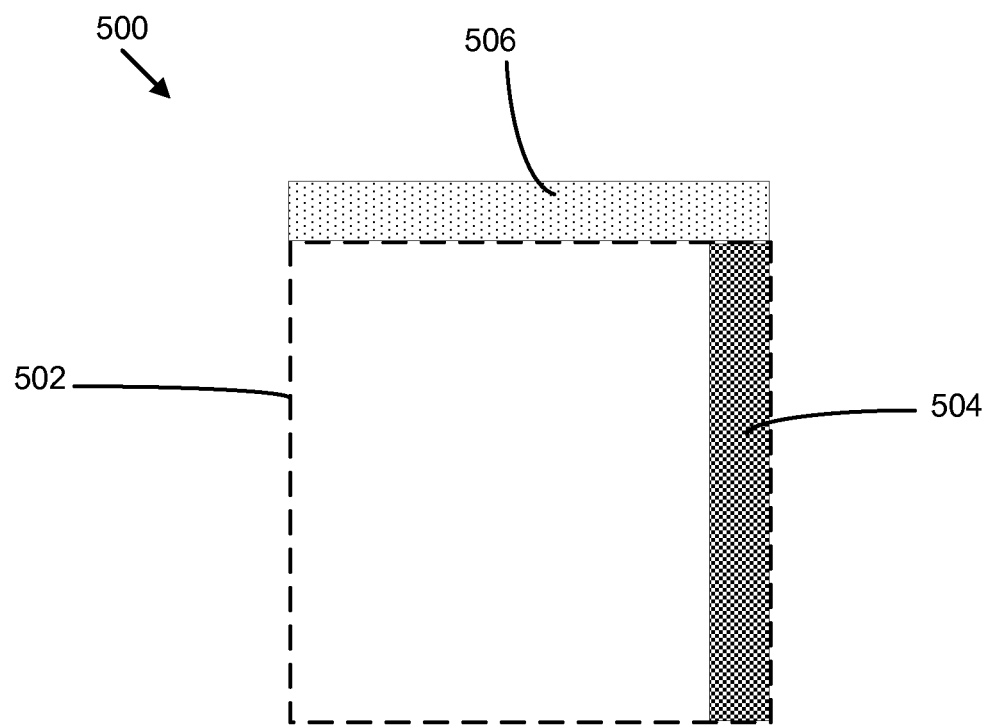
FIG. 5 is a layout view of the device level of an alternative memory device structure.

FIG. 5 is a layout view of the device level of an alternative memory device structure. The device level 500 includes a cylinder 502 represented by dashed lines. The cylinder 502 is defined by the perimeter of the memory array in the array region (not shown) and an axis normal to the array. The device level includes an x-decoder 504 and a y-decoder 506. The x-decoder 504 is disposed completely within the cylinder while the y-decoder 506 is disposed completely outside of the cylinder. In an alternative memory device structure, the x-decoder is disposed completely outside of the cylinder, while the y-decoder is disposed completely within the cylinder.

In another alternate embodiment of the memory device structure shown in FIGS. 3A, 3B, 4A, 4B and 5, the array level can include multiple layers of memory arrays stacked on top of each other, thereby forming a 3D memory array.

In another alternate embodiment, the x-decoders and y-decoders can have portions that are disposed outside of the cylinder within the device level. Specifically, in the alternate embodiment, the decoders can be disposed in generally the same arrangement within the device level as is shown in FIGS. 3A, 3B, 4A, 4B and 5, but not be aligned exactly with the sides of the memory array. As a result the decoders are partly disposed outside the cylinder within the device level.

Figure 6:
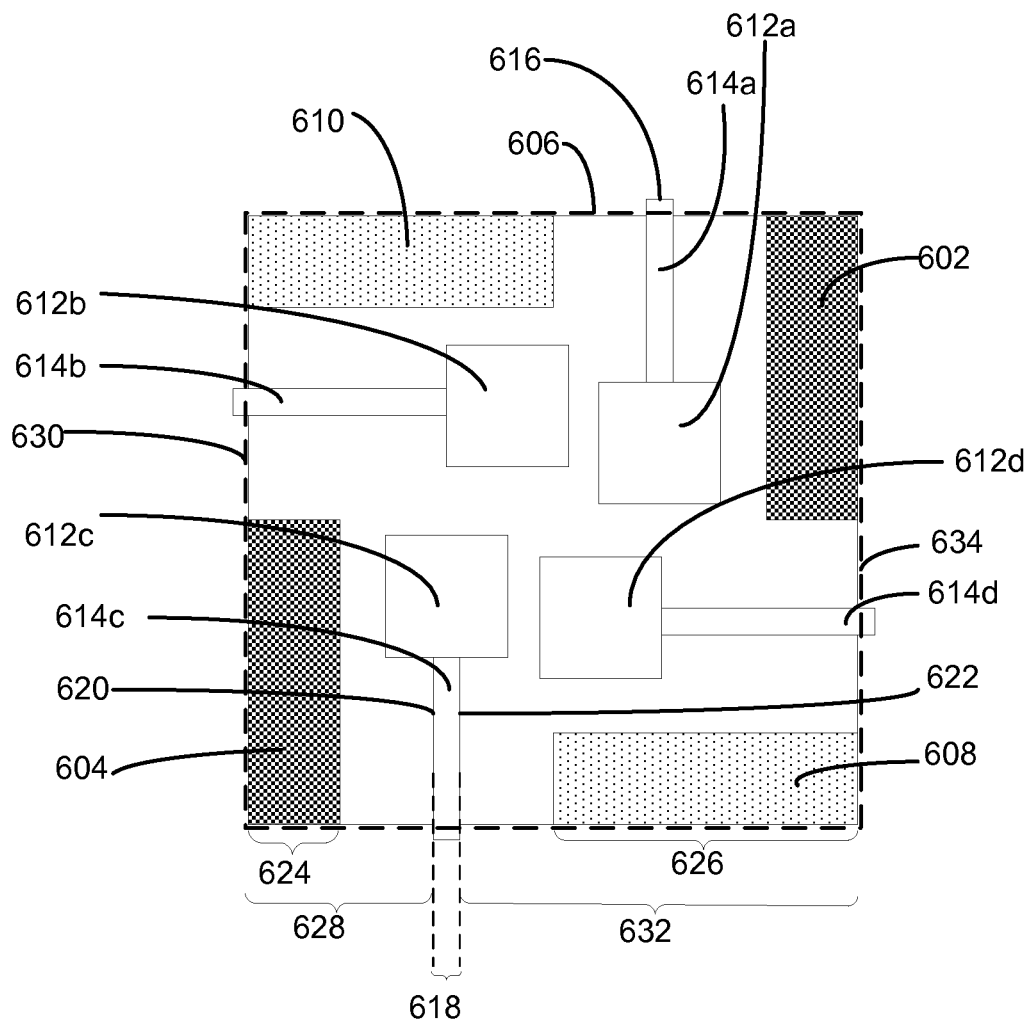
FIG. 6 shows a top view of the pad level on top of the device level shown in FIGS. 3A and 3B with the array level of the memory device structure omitted.

FIG. 6 shows a top view of the pad level on top of the device level shown in FIGS. 3A and 3B with the array level of the memory device structure omitted. The device level includes a first portion 602 and a second portion 604 of an x-decoder disposed within the cylinder 606 (represented by the dashed square) defined by the perimeter of the memory array in the array level (not shown). The device level also includes a first portion 608 and a second portion 610 of a y-decoder disposed within the cylinder 606.

The pad level includes a plurality of pads, of which four pads 612a-612d are illustrated for simplicity. There may be dozens of pads, or more, depending on the selected interconnect technology. A pad is a conductive plate or body configured for making a connection to an external circuit or wire. In one embodiment the pads 612a-612d are disposed within the cylinder 606 in the pad level. In another embodiment the pads 612a-612d are disposed in the pad level so that all or part of one or more pads is disposed outside of the cylinder 606 in the pad level. The pads can include I/O regions, the region being an area on the pad in which connections of data lines to external circuitry can be made. The pads can also include power supply regions, ground supply regions and data address regions. I/O connections can be made to the pads at the I/O regions, power supply connections can be made to the pads at the power regions, ground connections can be made to the pads at the ground regions and data address connections can be made to the pads at the address regions. A plurality of conductive lines 614a-614d couple the pads to the device level. The conductive lines 614a-614d have portions (e.g. 616) that extend from outside of the cylinder 606, in the array level, to inside of the cylinder, in the pad level, to make contact in the pad level. As a result, the conductive lines do not pass through the array of memory cells in the array level (not shown).

The conductive lines each have a width, so that the regions in which the conductive lines can be disposed are arranged according to the structure for efficient layout and connections. Specifically, conductive line region 614c has a width 618 that is the distance between opposing sides 620 and 622 of the conductive line region 614c. Each of the portions of the x-decoder and y-decoder has a width and a length. For example, the second portion 604 of the x-decoder has a width 624. The first portion 608 of the y-decoder has a length 626. A first distance 628 is the distance between side 620 of the conductive line region and the side 630 of the cylinder 606. A second distance 632 is the distance between side 622 of the conductive line region and the side 634 of the cylinder 606. Conductive line region 614c has a width 618 and is disposed in the pad level so that the distance 628 is greater than width 624 of the second portion 604 of the x-decoder and the second distance 632 is greater the length 626 of the first portion 608 of the y-decoder. This can be applied to all of the conductive line regions 614a-614d, so that the previously mentioned distances from the sides of any of the conductive lines to the opposing sides of the cylinder are greater than the width and length of the corresponding adjacent portions of the x-decoder and y-decoder. As a result, the conductive lines that couple the device level to the pads in the pad level are not in the same regions in the device level as the conductive lines that connect the decoders to the memory array in the array level.

Figure 7:
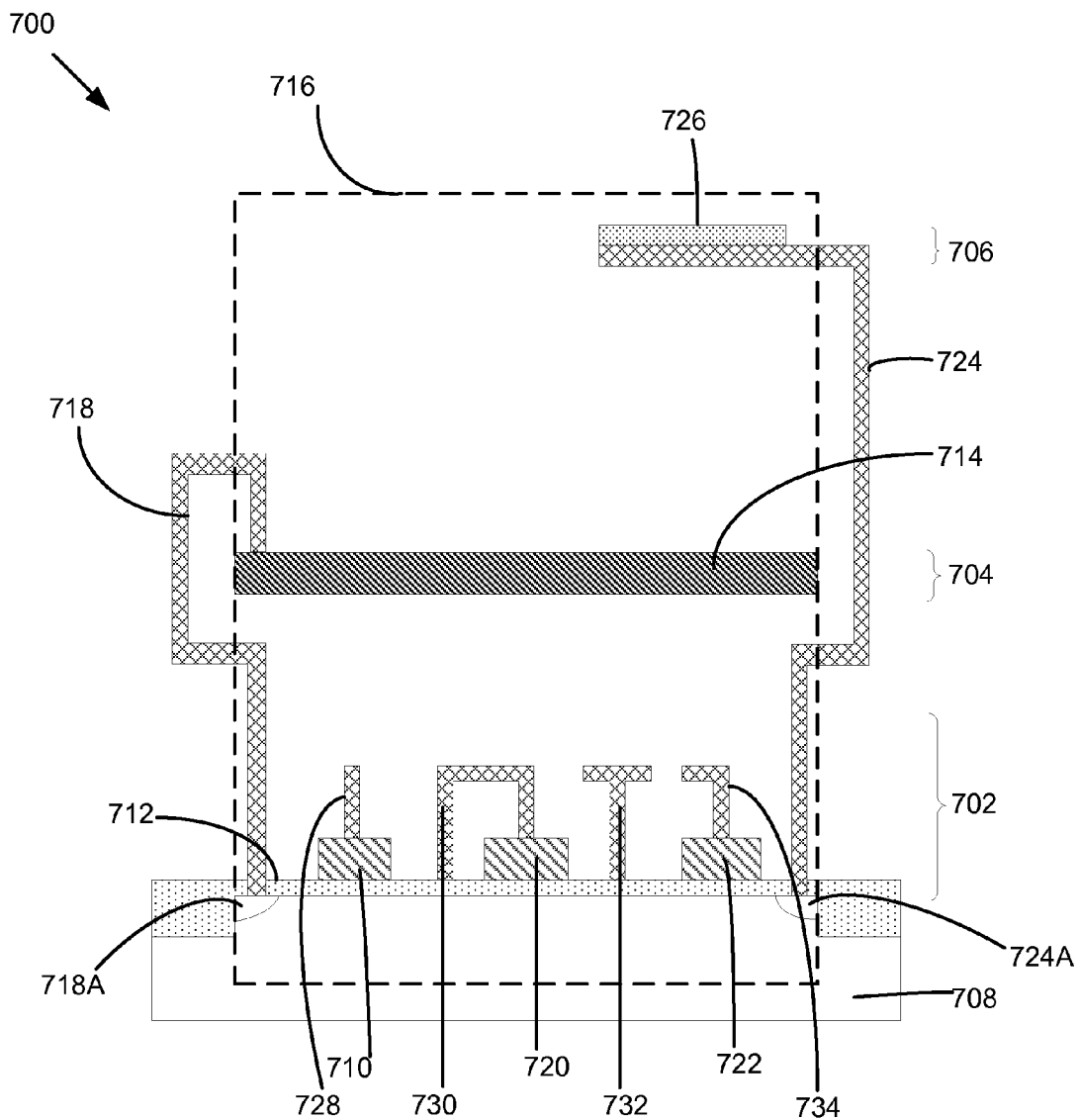
FIG. 7 is a simplified cross-sectional view of a memory device structure.

FIG. 7 is a simplified cross-sectional view of an example memory device structure 700 having a device level 702, an array level 704 and a pad level 706. These levels are disposed over a substrate 708.

The array level 704 includes a memory array 714 having bit lines and word lines. The perimeter of the memory array 714 defines a cylinder 716 that extends both above and below the memory array in the array level 704.

The device level includes logic devices used to form the peripheral circuits, including x-decoders, y-decoders and other peripheral circuitry. The drawing illustrates simplified parts of such logic devices disposed within the cylinder 716.

For heuristic purposes, three patterned polysilicon regions 710, 720 and 722 in a layer of polysilicon within the device level are shown. It is noted that in actuality thousands or millions of patterned polysilicon regions can be disposed in a layer of polysilicon within the cylinder in the device level. A dielectric layer 712 extends between the patterned polysilicon regions 710, 720 and 722 and the substrate 708. The patterned polysilicon regions 710, 720 and 722 can be the gates of corresponding transistors having source/drain regions (not shown) in the substrate 708. A portion of the x-decoder or the y-decoder can be formed in patterned polysilicon region 710, while other peripheral circuitry can be formed in the patterned polysilicon regions 720 and 722. The patterned polysilicon regions 710, 720 and 722 are within the cylinder 716. The device level also includes various interconnects 728, 730, 732 and 734 such as patterned metal layers and vias, disposed within the cylinder 716. The interconnects 728, 730, 732 and 734 connect the patterned polysilicon regions 710, 720 and 722 together. As a result, in the illustrated embodiment, a portion of the x-decoder or y-decoder and the other peripheral circuitry are disposed within the cylinder 716. In this example, the region 718A represents an output node of one, or output nodes of both, of the x-decoder and the y-decoder, both of which output nodes are position within the cylinder 176, and are connected to corresponding inter-level conductive lines (e.g. 718) in the plurality of inter-level conductive lines.

An inter-level conductive line 718 of a first plurality of inter-level conductive lines connects either word lines or bit lines of the array of memory cells in the array level 704 to the portion of the x-decoder or y-decoder in the patterned polysilicon region 710. Specifically, connection occurs as the inter-level conductive line 718 extends to the substrate 708, so that it is in direct contact with the source/drain region (not shown) in this example, of the transistor for which the conductive patterned polysilicon region 710 serves as the gate. The inter-level conductive line could alternatively connect to a landing area in a patterned polysilicon element, a metal line or other interconnect structure in the device level. A portion of the inter-level conductive line 718 extends out from the cylinder in the array level, so that the conductive line does not pass through the memory array 714 in the array level.

An inter-level conductive line 724 of a second plurality of inter-level conductive lines connects the device level to a pad 726 in the pad level 706. Specifically, the inter-level conductive line 724 extends from the pad 726 and makes direct contact with the substrate 708 in a region 724A in this example. In one example, the region 724A is an input node on an input/output driver that supplied address signals to the decoders. The inter-level conductive line could alternatively connect to a landing area in a patterned polysilicon element, a metal line, or other interconnect structure in the device level. In this example, through the direct contact with the substrate by the inter-level conductive line 724, the pad is connected to the other peripheral circuitry within the patterned polysilicon region 722. Inter-level conductive line 724 has a portion that extends out of the cylinder in the array level and back into the cylinder at the pad level. As a result, the inter-level conductive line does not pass through the memory array 714 in the array level.

In an alternative embodiment, the device level can be above the array level. In yet another alternative embodiment the array level can include multiple layers of arrays of memory cells, thereby creating a 3D array of memory cells.

Figure 8A:
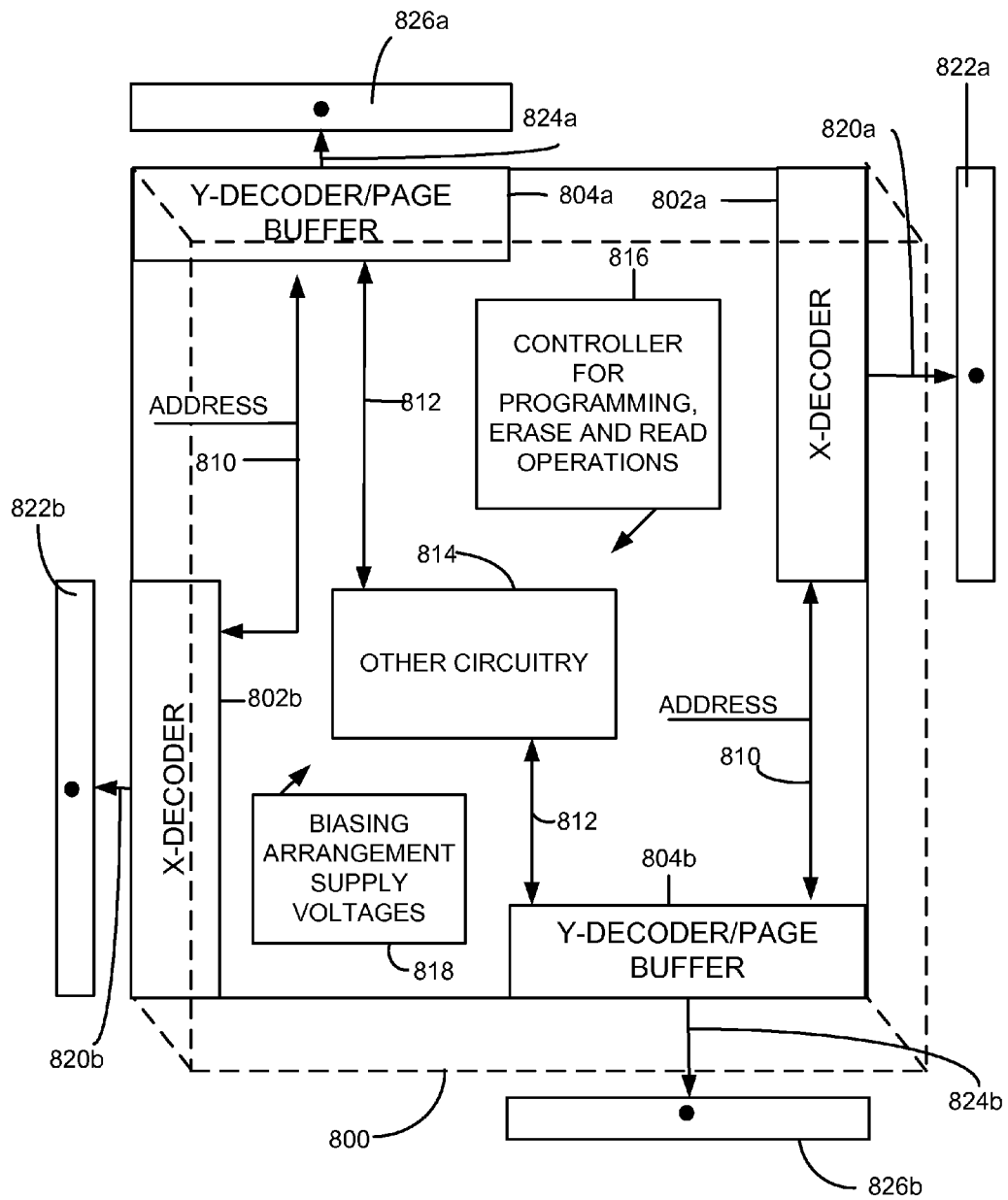
FIG. 8A shows a block diagram of the circuit elements in performing operations on an array of memory cells, of which any number or all of the circuit elements can be disposed within the cylinder defined by the perimeter of the array of memory cells.

FIG. 8A shows a block diagram of the circuit elements in a device level that can be disposed within the cylinder defined by the perimeter 800 of the memory array, which is projected above the device level in FIG. 8A as illustrated using a heuristic dashed line. The block diagram includes a memory cell array having a perimeter 800 in an array level shown as extending over all of the illustrated circuit elements in a device level. It is appreciated, however, that any number of the shown circuit elements can be under the array of memory cells. It is also appreciated that the levels can be switched so that the array of memory cells in the array level is underneath the circuit elements in the device level.

The circuit elements inside the cylinder in this example, include portions of an x-decoder 802a and 802b coupled to the word lines of the memory array in the array level. The portions of the x-decoder 802a and 802b are coupled to the word lines through lines 820a and 820b to vertical interconnection segments represented by the symbols 822a and 822b. Portions of a y-decoder and page buffers 804a and 804b are coupled to global bit lines through lines 824a and 824b to vertical interconnection segments represented by the symbols 826a and 826b. The global bit lines are coupled to local bit lines arranged along columns in the memory array in the array level. Either a portion or all of each of the vertical interconnection segments 822a, 822b, 826a and 826b extend outside of the cylinder defined by the perimeter 800 of the memory array between the device level and the array level.

Addresses are supplied on bus 810 to the portions of the x-decoder 802a and 802b and the portions of the y-decoder and page buffer 804a and 804b, optionally from a pad level (shown in FIG. 8B), or from I/O ports on the device level. Data is supplied via the data-in line 812 from other circuitry 814, such as special purpose application circuitry, or a combination of modules providing system-on-a-chip functionality supported by the array of memory cells. Data is supplied via the data-in line 812 to I/O ports optionally from a pad level (shown in FIG. 8B), or from I/O ports on the device level or to other data destinations internal or external to the integrated circuit memory.

A controller 816 provides signals to control the application of bias arrangement supply voltages generated or provided through the voltage supply or supplies in block 818 to carry out the various operations described herein. These operations include programming and erase operations and read operations. The controller can be implemented using special-purpose logic circuitry as known in the art. In alternative embodiments, the controller comprises a general-purpose processor, which may be implemented on the same integrated circuit, which executes a computer program to control the operations of the device. In yet other embodiments, a combination of special-purpose logic circuitry and a general-purpose processor may be utilized for implementation of the controller.

Figure 8B:
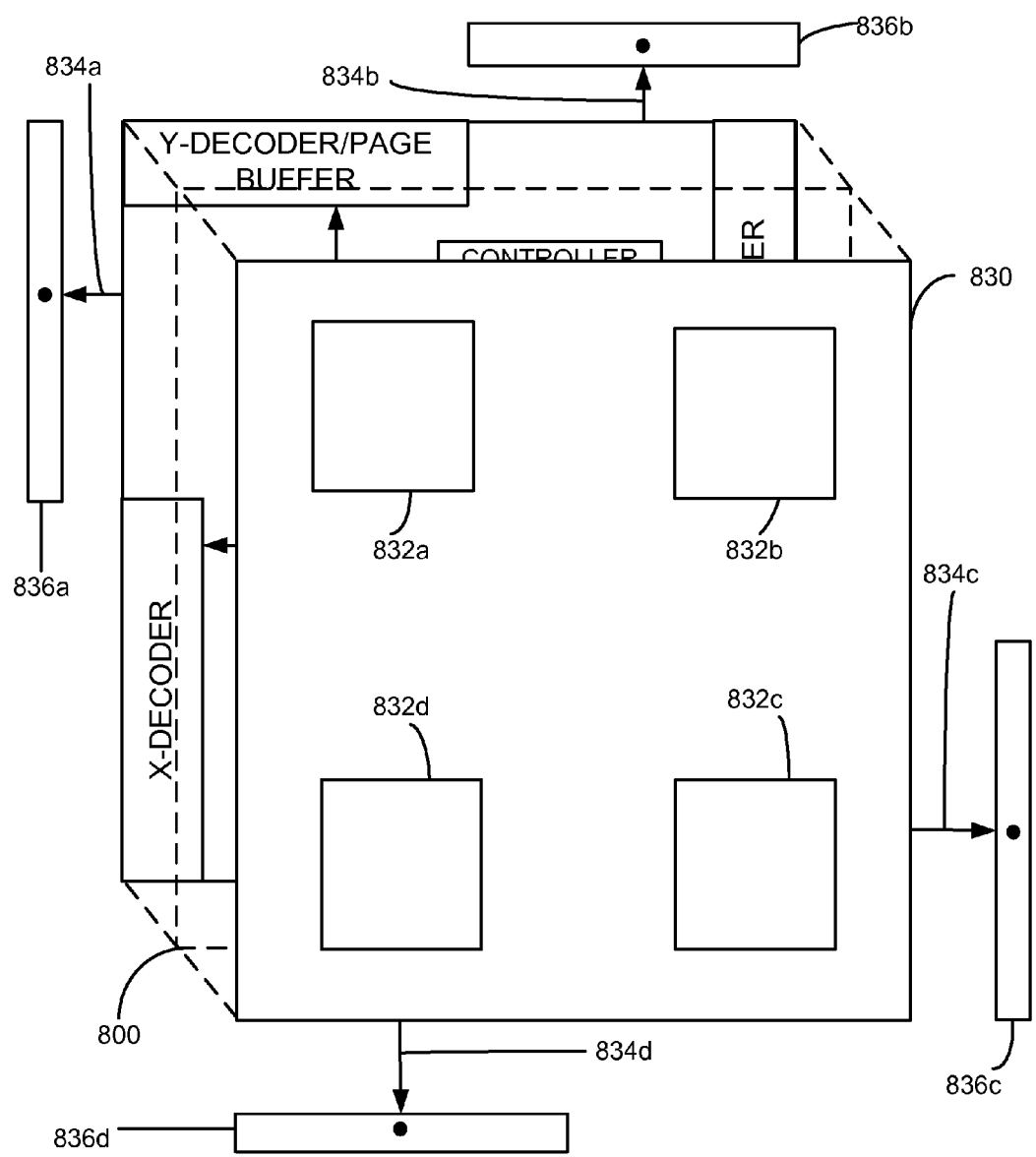
FIG. 8B shows the block diagram that is shown in FIG. 8A with a pad level over the device level and array level.

FIG. 8B shows the block diagram that is shown in FIG. 8A with a pad level 830 over the device level and array level. The array level includes a memory array with a perimeter 800 that defines a cylinder. The pad level includes a plurality of pads 832a-d. The device level is coupled to the pads through lines 834a-d to vertical interconnection segments represented by symbols 836a-d. Either a portion or all of each of the vertical interconnection segments 836a-d extend outside of the cylinder defined by the perimeter 800 of the memory array between the device level and the pad level.

While the present invention is disclosed by reference to the embodiments and examples detailed above, it is to be understood that these examples are intended in an illustrative rather than in a limiting sense. It is contemplated that modifications and combinations will readily occur to those skilled in the art, which modifications and combinations will be within the spirit of the invention and the scope of the following claims.

What is claimed is:

1. A memory device comprising:
   an array of memory cells in an array level, the array of memory cells having sides that define a perimeter;
   an x-decoder and a y-decoder in a device level, one or both of the x-decoder and the y-decoder being disposed at least partly within a cylinder defined by the perimeter;
   a first plurality of inter-level conductive lines connecting the x-decoder and the y-decoder in the device level to bit lines and word lines in the array level, the first inter-level conductive lines having portions that extend from outside of the cylinder to inside of the cylinder to make contact in the array level;
   a plurality of bonding pads in a pad level, the pad level being separate from the device level and the array level, the plurality of bonding pads at least partly disposed within the cylinder; and
   a second plurality of inter-level conductive lines coupled between the plurality of bonding pads and the device level, a portion of the second plurality of inter-level conductive lines extending from outside of the cylinder to inside of the cylinder to make contact in the pad level, wherein:
   the portions of the x-decoder each have a corresponding x-decoder width and x-decoder length, the portions of the y-decoder each have a corresponding y-decoder width and y-decoder length; and including:
      first and second distances, the first distance being the distance between a first side of one of the second plurality of inter-level conductive lines and a side of the cylinder that opposes the first side of the one of the second plurality of inter-level conductive lines, the second distance being the distance between a second side of the one of the second plurality of inter-level conductive lines and a side of the cylinder that opposes the second side of the one of the second plurality of conductive lines, the first distance being less than the second distance, the first distance being greater than both the x-decoder width and the y-decoder width, the second distance being greater than both the x-decoder length and the y-decoder length.

2. The memory device of claim 1, wherein both the x-decoder and the y-decoder are completely disposed within the cylinder.

3. The memory device of claim 1, wherein:
   a first portion of the x-decoder is aligned along a first side of the array and a second portion of the x-decoder is aligned along a second side of the array, the first and second sides of the array opposing each other; and
   a first portion of the y-decoder is aligned along a third side of the array and a second portion of the y-decoder is aligned along a fourth side of the array, the third and fourth sides of the array opposing each other and intersecting the first and second sides of the array.

4. The memory device of claim 3, wherein:
   a third portion of the x-decoder is aligned along the first side of the array and a fourth portion of the x-decoder is aligned along the second side of the array; and
   a third portion of the y-decoder is aligned along the third side of the array and a fourth portion of the y-decoder is aligned along the fourth side of the array.

5. The memory device of claim 1, further comprising: page buffers in the device level, the page buffers disposed within the cylinder.

6. The memory device of claim 1, further comprising:
   controller circuitry and supply voltage circuitry in the device level, the controller circuitry and the bias supply voltage circuitry disposed within the cylinder.

7. The memory device of claim 1, wherein the first plurality of inter-level conductive lines are disposed in a first plurality of regions in the device level and the second plurality of inter-level conductive lines are disposed in a second plurality of regions in the device level, the first plurality of regions being different from the second plurality of regions.

8. The memory device of claim 1, wherein the plurality of bonding pads includes an I/O pad, a power pad, a ground pad and an address pad.

9. A method of fabricating a memory device comprising:
   forming an array of memory cells in an array level, the array of memory cells having sides that define a perimeter;
   forming an x-decoder and a y-decoder in a device level, the x-decoder and the y-decoder disposed at least partly within a cylinder defined by the perimeter;
   forming a first plurality of inter-level conductive lines connecting the x-decoder and the y-decoder in the device level to bit lines and word lines in the array level, the first inter-level conductive lines having portions that extend from outside of the cylinder to inside of the cylinder to make contact in the array level;
   forming a plurality of bonding pads in a pad level, the pad level being separate from the device level and the array level, the plurality of bonding pads disposed at least partly in the cylinder; and
   forming a second plurality of inter-level conductive lines coupled between the plurality of bonding pads and the device level, a portion of the second plurality of inter-level conductive lines extending from outside of the cylinder to inside of the cylinder to make contact in the pad level, wherein:
   the portions of the x-decoder each have a corresponding x-decoder width and x-decoder length, the portions of the y-decoder each have a corresponding y-decoder width and y-decoder length; and including:
      first and second distances, the first distance being the distance between a first side of one of the second plurality of inter-level conductive lines and a side of the cylinder that opposes the first side of the one of the second plurality of inter-level conductive lines, the second distance being the distance between a second side of the one of the second plurality of inter-level conductive lines and a side of the cylinder that opposes the second side of the one of the second plurality of inter-level conductive lines, the first distance being less than the second distance, the first distance being greater than both the x-decoder width and the y-decoder width, the second distance being greater than both the x-decoder length and the y-decoder length.

10. The method of claim 9, wherein both the x-decoder and the y-decoder are completely disposed within the cylinder defined by the perimeter.

11. The method of claim 9, wherein:
   a first portion of the x-decoder is aligned along a first side of the array and a second portion of the x-decoder is aligned along a second side of the array, the first and second sides of the array opposing each other; and
   a first portion of the y-decoder is aligned along a third side of the array and a second portion of the y-decoder is aligned along a fourth side of the array, the third and fourth sides of the array opposing each other and intersecting the first and second sides of the array.

12. The method of claim 11, wherein:
a third portion of the x-decoder is aligned along the first side of the array and a fourth portion of the x-decoder is aligned along the second side of the array; and
a third portion of the y-decoder is aligned along the third side of the array and a fourth portion of the y-decoder is aligned along the fourth side of the array.

13. The method of claim 9, further comprising:
forming page buffers in the device level, the page buffers disposed within the cylinder.

14. The method of claim 9, further comprising:
forming controller circuitry and supply voltage circuitry in the device level, the controller circuitry and the bias supply voltage circuitry disposed within the cylinder.

15. The method of claim 9, wherein the first plurality of inter-level conductive lines are disposed in a first plurality of regions in the device level and the second plurality of inter-level conductive lines are disposed in a second plurality of regions in the device level, the first plurality of regions being different from the second plurality of regions.

16. The method of claim 9, wherein the plurality of bonding pads includes an I/O pad, a power pad, a ground pad and an address pad.

* * * * *